United States Patent
Dryer et al.

(10) Patent No.: US 9,844,940 B2
(45) Date of Patent: *Dec. 19, 2017

(54) PRINTHEAD CARTRIDGE WITH HYDROPHOBIC COATING

(71) Applicant: FUNAI ELECTRIC CO., LTD., Osaka (JP)

(72) Inventors: Paul W. Dryer, Lexington, KY (US); Christopher A. Craft, Lexington, KY (US)

(73) Assignee: Funai Electric Co., Ltd., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/485,744

(22) Filed: Apr. 12, 2017

(65) Prior Publication Data
US 2017/0217170 A1 Aug. 3, 2017

Related U.S. Application Data

(63) Continuation of application No. 15/153,520, filed on May 12, 2016, now Pat. No. 9,630,416, which is a continuation of application No. 14/568,776, filed on Dec. 12, 2014, now Pat. No. 9,365,044.

(51) Int. Cl.
| | | |
|---|---|---|
| *B41J 2/175* | (2006.01) | |
| *B41J 2/14* | (2006.01) | |
| *B05D 1/18* | (2006.01) | |
| *C23C 16/44* | (2006.01) | |

(52) U.S. Cl.
CPC ............ *B41J 2/1433* (2013.01); *B05D 1/18* (2013.01); *B41J 2/1753* (2013.01); *B41J 2/17513* (2013.01); *B41J 2/17523* (2013.01); *B41J 2/17536* (2013.01); *B41J 2/17553* (2013.01); *B41J 2/17559* (2013.01); *C23C 16/44* (2013.01)

(58) Field of Classification Search
CPC .... B41J 2/175; B41J 2/17513; B41J 2/17523; B41J 2/1753; B41J 2/17536; B41J 2/17553; B41J 2/17559; C23C 16/44; B05D 1/18

See application file for complete search history.

(56) References Cited

U.S. PATENT DOCUMENTS

| | | |
|---|---|---|
| 5,363,130 A | 11/1994 | Cowger et al. |
| 5,600,358 A | 2/1997 | Baldwin et al. |
| 5,782,383 A | 7/1998 | Robinson |
| 6,296,353 B1 | 10/2001 | Thielman et al. |
| 6,391,541 B1 * | 5/2002 | Petersen ................ B01L 3/502 241/2 |

(Continued)

FOREIGN PATENT DOCUMENTS

| | | |
|---|---|---|
| JP | 2000326527 | 11/2000 |
| JP | 2004148583 | 5/2004 |

*Primary Examiner* — Anh T. N. Vo
(74) *Attorney, Agent, or Firm* — Amster, Rothstein & Ebenstein, LLP

(57) ABSTRACT

A print cartridge including a cartridge housing having a container body and a lid that encloses the container body. The lid includes a bottom surface and a top surface. One or more air vent openings are formed through the entire thickness of the lid from the top surface to the bottom surface. A hydrophobic coating is disposed on at least one of the top or the bottom surfaces of the lid, with the hydrophobic coating being absent over the one or more air vent openings. The hydrophobic coating is deposited in liquid or gaseous form.

14 Claims, 3 Drawing Sheets

(56) References Cited

U.S. PATENT DOCUMENTS

| | | | |
|---|---|---|---|
| 6,444,275 B1 | 9/2002 | Kuhman et al. | |
| 6,830,321 B2 | 12/2004 | Okamoto et al. | |
| 7,185,977 B2 | 3/2007 | Kyogoku et al. | |
| 7,258,434 B2 | 8/2007 | Smith et al. | |
| 7,445,323 B2 | 11/2008 | Anderson et al. | |
| 7,473,302 B2 | 1/2009 | Ueda | |
| 7,766,466 B2 | 8/2010 | Taniguchi et al. | |
| 7,874,662 B2 * | 1/2011 | Silverbrook | B41J 2/175 347/85 |
| 7,938,523 B2 | 5/2011 | Aldrich | |
| 8,469,499 B2 | 6/2013 | Rittgers et al. | |
| 8,500,226 B2 | 8/2013 | Hibbard et al. | |
| 8,603,034 B2 | 12/2013 | Lynch | |
| 9,365,044 B1 * | 6/2016 | Dryer | B41J 2/1753 |
| 9,630,416 B2 * | 4/2017 | Dryer | B41J 2/1753 |
| 2001/0037629 A1 | 11/2001 | Mashiko et al. | |
| 2005/0110851 A1 | 5/2005 | Smith et al. | |

* cited by examiner

PRINTHEAD CARTRIDGE WITH HYDROPHOBIC COATING

RELATED APPLICATION

This application is a Continuation of and claims priority to U.S. patent application Ser. No. 15/153,520, filed May 12, 2016 which is a Continuation of and claims priority to U.S. patent application Ser. No. 14/568,776, filed Dec. 12, 2014 (now U.S. Pat. No. 9,365,044), the contents of which are incorporated herein by reference in their entirety.

FIELD

This invention is related to inkjet printheads, and in particular, to hydrophobic coatings for inkjet printheads.

BACKGROUND

In general, an inkjet printhead has a housing or body that defines an interior filled with one or more inks. To prevent back pressure build-up during printing, each compartment contains a lung or a foam insert and an air diffusion vent that fluidly communicates the interior to atmospheric pressure. Often times, the air diffusion vent embodies a circuitous or torturous path in the form of a serpentine channel that snakes from a hole fluidly connected to the interior, and formed through a thickness of the housing, to a terminal end thereof. A label, or other covering, typically lays over the hole and portions of the air diffusion vent, but not the terminal ends, to slow the effects of ink evaporation.

If a printhead is placed in a low atmospheric condition (i.e. shipping), it is possible that ink can leak out of the vent hole. For example, during shipping on an airplane, printheads are exposed to low atmospheric conditions (i.e. flying at an altitude of 19000 ft, the atmospheric pressure is reduced by ½ compared to sea level altitude) which can cause leaks. In order to prevent such leaks, a sheet of hydrophobic film material may be placed on the cartridge lid so as to cover the air diffusion vent holes.

SUMMARY OF THE INVENTION

An object of the present invention is to prevent ink from leaking out of the vent hole of an inkjet printhead while still allowing the vent hole to properly vent the printhead.

A print cartridge according to an exemplary embodiment of the present invention comprises: a cartridge housing comprising a container body and a lid that encloses the container body, the lid comprising a bottom surface and a top surface; a fluid reservoir disposed within the container body that receives and contains fluid; a fluid ejector chip disposed on the cartridge housing and comprising a plurality of heating elements that eject the fluid from the print cartridge; one or more air vent openings formed through the entire thickness of the lid from the top surface to the bottom surface; and a hydrophobic coating disposed on at least one of the top or the bottom surfaces of the lid, the hydrophobic coating being absent over the one or more air vent openings.

An inkjet printer according to an exemplary embodiment of the present invention comprises the print cartridge described above.

In at least one embodiment, the hydrophobic coating is disposed on the top and the bottom surfaces of the lid.

In at least one embodiment, the hydrophobic coating is applied in liquid or gas form.

In at least one embodiment, the hydrophobic coating comprises a fluorochemical polymer.

In at least one embodiment, the hydrophobic coating comprises a non-fluorochemical polymer.

In at least one embodiment, the hydrophobic coating comprises n-Octadecyltrichlorosilane or trimethylchlorosilane.

In at least one embodiment, the one or more air vent holes form portions of one or more corresponding air diffusion vents.

In at least one embodiment, each of the one or more air diffusion vents comprises a channel that follows a serpentine path.

In at least one embodiment, the print cartridge further comprises a label disposed over the lid.

In at least one embodiment, the print cartridge leaks fluid from the one or more air vent openings only at a pressure below 250 mtorr.

A method of forming a print cartridge according to an exemplary embodiment of the present invention comprises: providing a cartridge housing comprising a container body and a lid that encloses the container body, the lid comprising a bottom surface and a top surface; and depositing, in liquid or vapor form, a hydrophobic coating on at least one of the top or bottom surfaces of the lid.

In at least one embodiment, the step of depositing comprises depositing a liquid solution.

In at least one embodiment, the step of depositing comprises immersing the lid in the liquid solution.

In at least one embodiment, the step of depositing comprises dispensing the liquid solution onto the lid.

In at least one embodiment, the liquid solution comprises a fluorochemical polymer.

In at least one embodiment, the step of depositing comprises chemical vapor deposition of a gaseous mixture.

In at least one embodiment, the method further comprises the step of adhering a label to the lid prior to the step of depositing.

Other features and advantages of embodiments of the invention will become readily apparent from the following detailed description, the accompanying drawings and the appended claims.

BRIEF DESCRIPTION OF THE DRAWINGS

The features and advantages of exemplary embodiments of the present invention will be more fully understood with reference to the following, detailed description when taken in conjunction with the accompanying figures, wherein.

DETAILED DESCRIPTION

Figure 1:
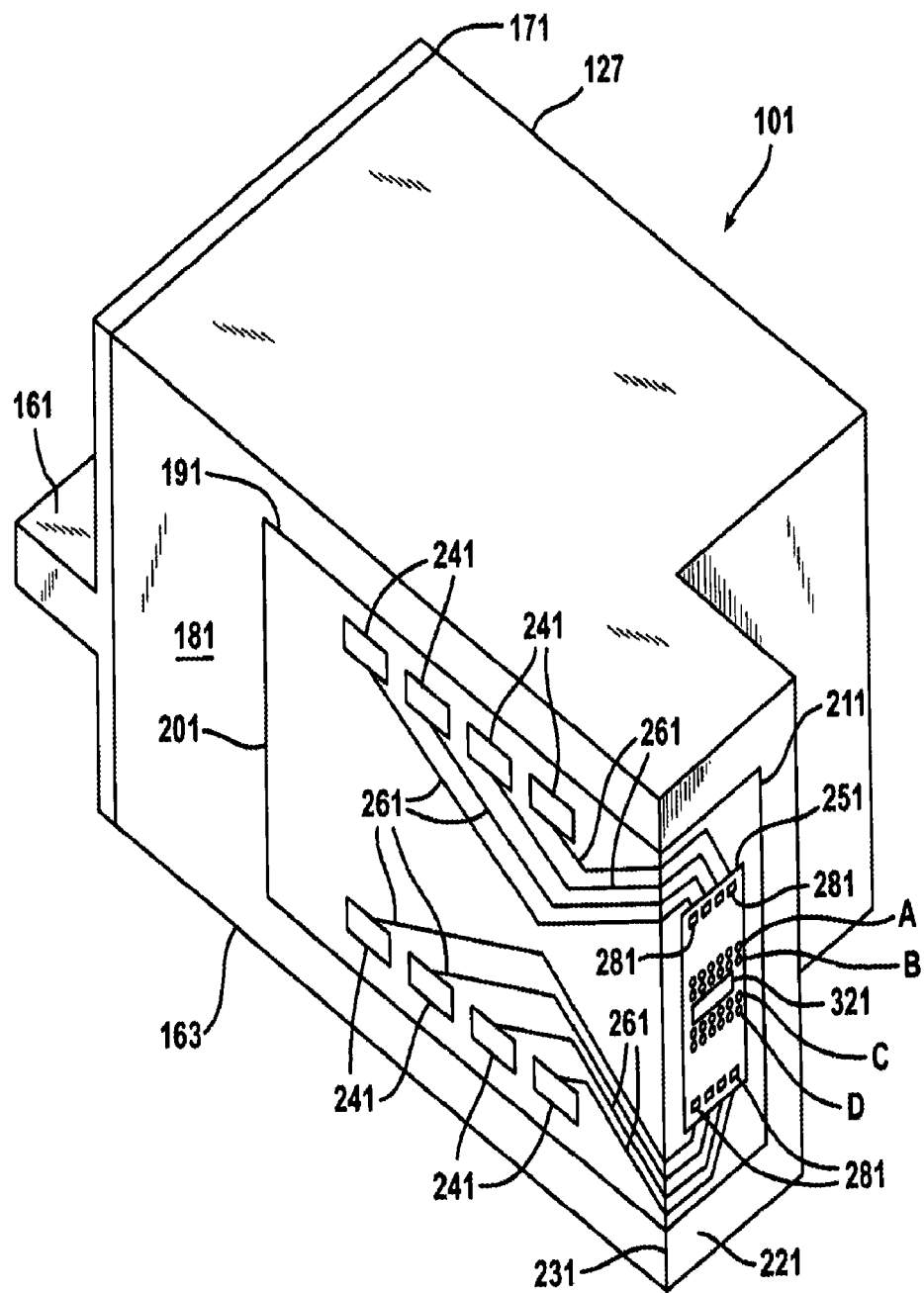
FIG. 1 is a perspective view of an inkjet printhead according to an exemplary embodiment of the present invention.

The headings used herein are for organizational purposes only and are not meant to be used to limit the scope of the description or the claims. As used throughout this application, the words "may" and "can" are used in a permissive sense (i.e., meaning having the potential to), rather than the mandatory sense (i.e., meaning must). Similarly, the words "include," "including," and "includes" mean including but not limited to. To facilitate understanding, like reference numerals have been used, where possible, to designate like elements common to the figures.

FIG. 1 shows a perspective view of an inkjet printhead, generally designated by reference number 101, according to an exemplary embodiment of the present invention. The printhead 101 has a housing 127 formed of a lid 161 and a body 163 assembled together through attachment or connection of a lid bottom surface and a body top surface at interface 171. The shape of the housing varies and depends upon the external device that carries or contains the printhead, the amount of ink to be contained in the printhead and whether the printhead contains one or more varieties of ink. In any embodiment, the housing or body has at least one compartment in an interior thereof for holding an initial or refillable supply of ink and a structure, such as a foam insert, lung or other, for maintaining appropriate backpressure in the inkjet printhead during use. In one embodiment, the internal compartment includes three chambers for containing three supplies of ink, especially cyan, magenta and yellow ink. In other embodiments, the compartment contains black ink, photo-ink and/or plurals of cyan, magenta or yellow ink. It will be appreciated that fluid connections (not shown) may exist to connect the compartment(s) to a remote source of bulk ink.

A portion 191 of a tape automated bond (TAB) circuit 201 adheres to one surface 181 of the housing while another portion 211 adheres to another surface 221. As shown, the two surfaces 181, 221 exist perpendicularly to one another about an edge 231.

The TAB circuit 201 has a plurality of input/output (I/O) connectors 241 fabricated thereon for electrically connecting a heater chip 251 to an external device, such as a printer, fax machine, copier, photo-printer, plotter, all-in-one, etc., during use. Pluralities of electrical conductors 261 exist on the TAB circuit 201 to electrically connect and short the I/O connectors 241 to the bond pads 281 of the heater chip 251 and various manufacturing techniques are known for facilitating such connections. It will be appreciated that while eight I/O connectors 241, eight electrical conductors 261 and eight bond pads 281 are shown, any number are embraced herein. It is also to be appreciated that such number of connectors, conductors and bond pads may not be equal to one another.

The heater chip 251 contains at least one ink via 321 that fluidly connects to a supply of ink in an interior of the housing. Typically, the number of ink vias of the heater chip corresponds one-to-one with the number of ink types contained within the housing interior. The vias usually reside side-by-side or end-to-end. During printhead manufacturing, the heater chip 251 preferably attaches to the housing with any of a variety of adhesives, epoxies, etc. well known in the art. As shown, the heater chip contains four rows (rows A-row D) of resistive heating elements, or heaters. For simplicity in this crowded figure, dots depict the heaters in the rows and typical printheads contain hundreds of heaters. It will be appreciated that the heaters of the heater chip preferably become formed as a series of thin film layers made via growth, deposition, masking, photolithography and/or etching or other processing steps. A nozzle plate, not shown, with pluralities of nozzle holes adheres over or is fabricated with the heater chip during thin film processing such that the nozzle holes align with the heaters for ejecting ink during use.

Figure 2:
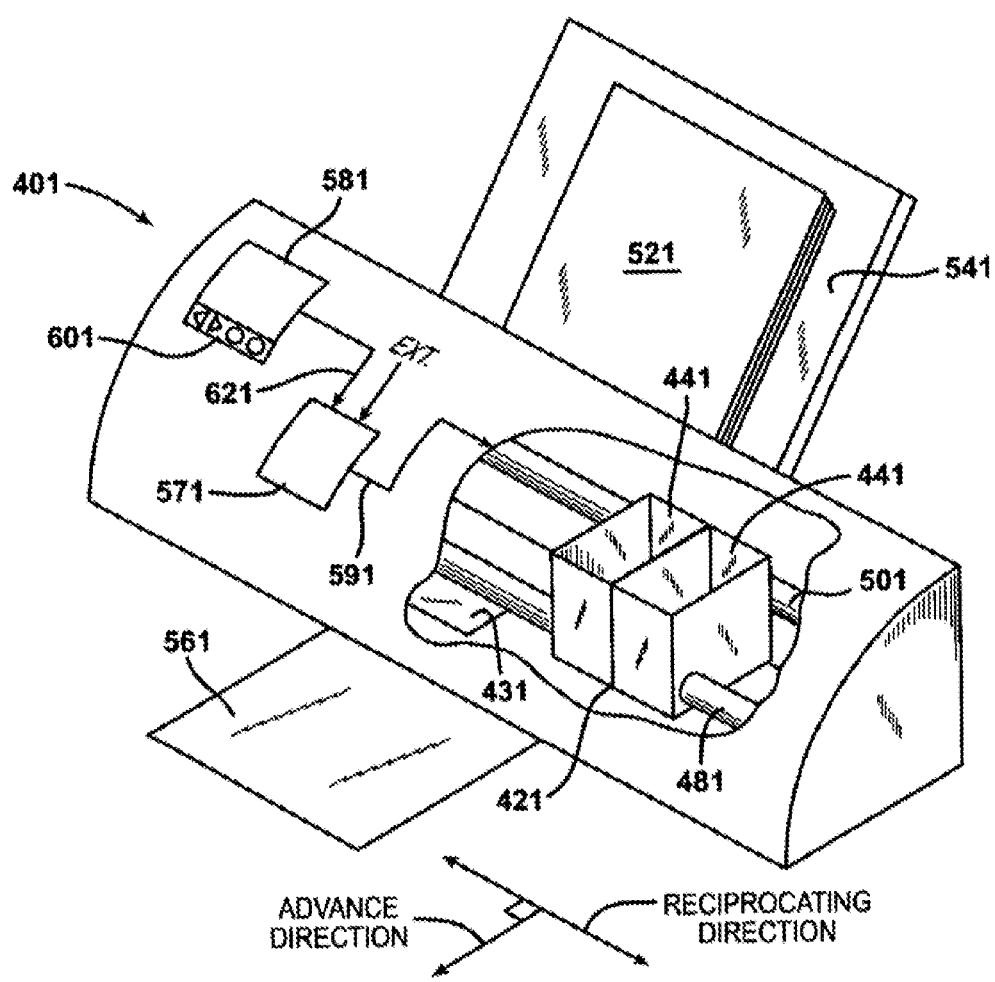
FIG. 2 is a perspective view of an inkjet printer according to an exemplary embodiment of the present invention.

With reference to FIG. 2, an external device in the form of an inkjet printer, for containing the printhead 101, is shown generally as 401. The printer 401 includes a carriage 421 having a plurality of slots 441 for containing one or more printheads. The carriage 421 is caused to reciprocate (via an output 591 of a controller 571) along a shaft 481 above a print zone 431 by a motive force supplied to a drive belt 501 as is well known in the art. The reciprocation of the carriage 421 is performed relative to a print medium, such as a sheet of paper 521, that is advanced in the printer 401 along a paper path from an input tray 541, through the print zone 431, to an output tray 561.

In the print zone, the carriage 421 reciprocates in the Reciprocating Direction generally perpendicularly to the paper Advance Direction as shown by the arrows. Ink drops from the printheads are caused to be ejected from the heater chip 251 (FIG. 7) at such times pursuant to commands of a printer microprocessor or other controller 571. The timing of the ink drop emissions corresponds to a pattern of pixels of the image being printed. Often times, such patterns are generated in devices electrically connected to the controller (via Ext. input) that are external to the printer such as a computer, a scanner, a camera, a visual display unit, a personal data assistant, or other. A control panel 581 having user selection interface 601 may also provide input 621 to the controller 571 to enable additional printer capabilities and robustness.

To print or emit a single drop of ink, the heaters (the dots of rows A-D, FIG. 7) are uniquely addressed with a small amount of current to rapidly heat a small volume of ink. This causes the ink to vaporize in a local ink chamber and be ejected through the nozzle plate towards the print medium.

As described herein, the term inkjet printhead may alternatively include piezoelectric technology, or other, and may embody a side-shooter structure instead of the roof-shooter structure shown.

Figure 3:
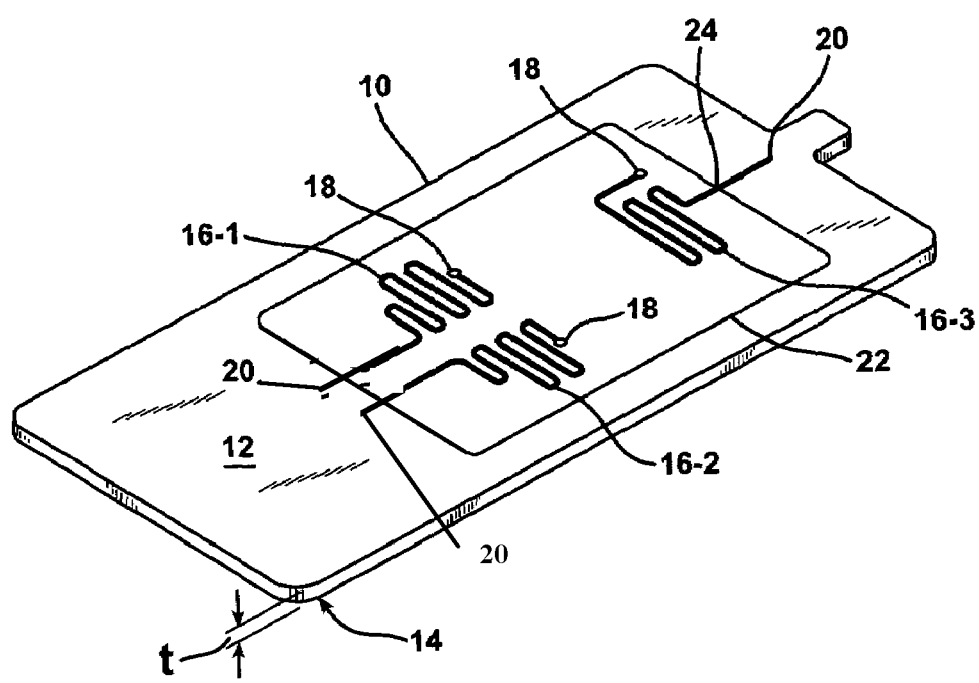
FIG. 3 is a perspective view of a lid of an inkjet printhead according to an exemplary embodiment of the present invention.

FIG. 3 shows a top perspective view of a lid, generally designated by reference number 10 (alternatively: lid 161, FIG. 7), according to an exemplary embodiment of the present invention. The lid 10 has a thickness, t, defined between a top surface 12 and a generally parallel bottom surface 14. In one embodiment, three air diffusion vents 16-1, 16-2, 16-3, reside in the top surface and embody serpentine channels cut to a desired depth in the lid thickness. The channels snake from a vent hole 18 at one terminal end thereof to a termination point 20 at the other terminal end. In other embodiments, the air diffusion vents exist in numbers other than three and reside in any portion of the inkjet printhead housing including the body and/or combinations of the body and lid. Each of the vent holes extends completely through the lid from the top to the bottom surface to create a fluid connection between the interior of the inkjet printhead and the air diffusion vent. In this manner, the interior of the printhead can vent to atmosphere to prevent backpressure build-up during use. Although not shown, the cross-section of the vent hole preferably comprises a substantially cylindrical cross-section having constant area.

A label 22 adheres or attaches to the top surface of the lid with a suitable epoxy or other adhesive. The label 22 is positioned so as to cover or reside over a portion of the air diffusion vents 16-1, 16-2, 16-3 while leaving the terminal ends of the diffusion vents 16-1, 16-2, 16-3 exposed. In this way, the air diffusion vents 16-1, 16-2, 16-3 are allowed fluid communication with atmospheric pressure during use. As a representative example, a manufacturer would place the label in this position if it needed to fluidly communicate three air diffusion vents with atmosphere such as when an inkjet printhead content includes tri-color inks, such as cyan, magenta and yellow.

In the conventional design, any ink in contact with the lid may wick through the vent holes and out the serpentine vent. The present invention addresses this issue by placing a hydrophobic coating on the lid to prevent the ink from leaking out while still allowing the printhead to vent. In particular, according to the present invention, the hydrophobic coating is applied to the lid in a liquid or vapor form.

According to an exemplary embodiment of the present invention, the hydrophobic coating applied to the lid 10 is a fluorochemical polymer solution, such as, for example, a fluorochemical acrylic polymer carried in a hydrofluoroether solvent. Specific examples of such coatings include Novec™ 1700 and Novec™ 2702, available from 3M Company, of St. Paul, Minn., USA. In another exemplary embodiment, the hydrophobic coating may include a non-fluorochemical polymer, such as, for example, n-Octadecyltrichlorosilane or trimethylchlorosilane. The liquid coating may be applied by, for example, immersing the entire lid 10 in a bath of the solution. The label 22 is preferably placed on the lid 10 prior to immersion so that the hydrophobic coating does not interfere with the adherence of the label 22 to the lid 10. The liquid coating may alternatively be applied using a dispense system to dispense the solution only in the air diffusion vents 16-1, 16-2, 16-3, including serpentine vent paths and the vent holes 18 (so that the resulting coating does not cover the vent holes 18). Examples of a suitable dispense system include the automated dispense systems available from Palomar Technologies, of Carlsbad, Calif., USA.

According to another exemplary embodiment of the present invention, the hydrophobic coating is applied to the lid 10 using vapor deposition. A suitable vapor deposition tool is, for example, the IST tool, available from Integrated Surface Technologies, of Menlo Park, Calif., USA. With this method, the coating is preferably deposited on the lid 10 after the label is placed. The coating may be comprised of three layers, including an alumina seed layer, created using trimethylaluminum, to bond to the lid, a silica layer, created using 1,2-bis(trichlorosilyl)ethane, to bond to alumina and provide an active surface for a self-assembled monolayer, and the self-assembled monolayer to create the hydrophobic surface. Various contact angles for the self-assembled monolayer may be created using the following molecules: (heptadecafluoro-1,1,2,2-tetrahydrodecyl)trichlorosilane, nonofluorohexyltrimethoxysilane, n-octyltrichlorosilane and/or (tridecafluoro-1,1,2,2-tetrahydrooctyl)trichlorosilane.

While particular embodiments of the invention have been illustrated and described, it would be obvious to those skilled in the art that various other changes and modifications may be made without departing from the spirit and scope of the invention. It is therefore intended to cover in the appended claims all such changes and modifications that are within the scope of this invention.

What is claimed is:

1. A printhead cartridge comprising:
   a cartridge housing comprising a lid;
   one or more air vent openings formed in the lid;
   a label disposed over a first portion of a top surface of the lid; and
   a hydrophobic coating chemically bonded to a second portion of the top surface and to a bottom surface of the lid, the first and second portions being different in location on the top surface of the lid and the hydrophobic coating being absent over at least a portion of the one or more air vent openings.

2. The print cartridge of claim 1, wherein the hydrophobic coating is applied in liquid or gas form.

3. The print cartridge of claim 1, wherein the hydrophobic coating comprises at least one of a fluorochemical polymer or a non-fluorochemical polymer.

4. The print cartridge of claim 1, wherein the one or more air vent openings comprise one or more corresponding air diffusion vents.

5. The print cartridge of claim 4, wherein each of the one or more air diffusion vents comprises a channel that follows a serpentine path.

6. The printhead cartridge of claim 5, wherein the hydrophobic coating is dispensed in the channel.

7. The printhead cartridge of claim 1, wherein the label is disposed over a portion of the one or more air vent openings.

8. An inkjet printer comprising:
   a housing;
   a carriage disposed within the housing; and
   one or more printhead assemblies arranged on the carriage, wherein at least one of the one or more printhead assemblies comprises a printhead cartridge comprising:
   a cartridge housing comprising a lid;
   one or more air vent openings formed in the lid;
   a label disposed over a first portion of a top surface of the lid; and
   a hydrophobic coating chemically bonded to a second portion of the top surface and to a bottom surface of the lid, the first and second portions being different in location on the top surface of the lid and the hydrophobic coating being absent over at least a portion of the one or more air vent openings.

9. The inkjet printer of claim 8, wherein the hydrophobic coating is applied in liquid or gas form.

10. The inkjet printer of claim 8, wherein the hydrophobic coating comprises at least one of a fluorochemical polymer or a non-fluorochemical polymer.

11. The inkjet printer of claim 8, wherein the one or more air vent openings comprise one or more corresponding air diffusion vents.

12. The inkjet printer of claim 11, wherein each of the one or more air diffusion vents comprises a channel that follows a serpentine path.

13. The inkjet printer of claim 12, wherein the hydrophobic coating is dispensed in the channel.

14. The inkjet printer of claim 8, wherein the label is disposed over a portion of the one or more air vent openings.

* * * * *